United States Patent [19]

Okawa et al.

[11] Patent Number: 5,215,929
[45] Date of Patent: Jun. 1, 1993

[54] METHOD OF MANUFACTURING PN-JUNCTION DEVICE II-VI COMPOUND SEMICONDUCTOR

[75] Inventors: Kazuhiro Okawa; Tsuneo Mitsuyu, both of Hirakata, Japan

[73] Assignee: Matsushita Electric Industrial Co., Ltd., Osaka, Japan

[21] Appl. No.: 800,415

[22] Filed: Nov. 29, 1991

[30] Foreign Application Priority Data

Nov. 29, 1990 [JP] Japan ................. 2-335906

[51] Int. Cl.⁵ ............... H01L 21/265; H01L 21/20
[52] U.S. Cl. ......................... 437/23; 437/127; 437/228
[58] Field of Search ............ 437/23, 110, 127–133, 437/126, 228; 156/643; 357/16, 17

[56] References Cited

U.S. PATENT DOCUMENTS

| | | | |
|---|---|---|---|
| 4,473,938 | 10/1984 | Kobayashi et al. | 437/127 |
| 4,648,938 | 3/1987 | Ashlay et al. | 156/643 |
| 4,741,801 | 5/1988 | Coleman | 156/643 |
| 4,866,489 | 9/1989 | Yokogawa et al. | 357/17 |
| 4,963,507 | 10/1990 | Amann et al. | 437/153 |
| 5,045,894 | 9/1991 | Migita et al. | 357/17 |

FOREIGN PATENT DOCUMENTS

| | | |
|---|---|---|
| 61-26271 | 2/1986 | Japan . |
| 61-144079 | 7/1986 | Japan . |
| 62-224985 | 10/1987 | Japan . |
| 2-5578 | 1/1990 | Japan . |
| 2-142124 | 5/1990 | Japan ............ 204/192.1 |

Primary Examiner—Olik Chaudhuri
Assistant Examiner—Loc Q. Trinh
Attorney, Agent, or Firm—Ratner & Prestia

[57] ABSTRACT

This invention relates to a pn-junction device, especially a blue light-emitting diode and a method of the manufacturing thereof. The pn-junction is formed between a superlattice region and a n-type semiconductor region, the superlattice region consisting of a plurality of stacked pairs of ZnSe semiconductor layer and acceptor-impurity-doped $ZnS_{0.12}Se_{0.88}$ mixed crystal semiconductor layer formed on a part of a buffer layer of $ZnS_{0.06}Se_{0.94}$ etc. which is formed on a crystalline substrate of GaAs etc., the n-type semiconductor region being formed on the part of the buffer layer, where the superlattice is not formed, and the side wall of the superlattice region contiguous to the n-type region to form pn-junction being made clean by etching, so that a pn-junction of n-type semiconductor and p-type semiconductor having high carrier-density resulted.

8 Claims, 3 Drawing Sheets

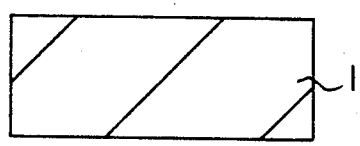
F I G. 1(a)
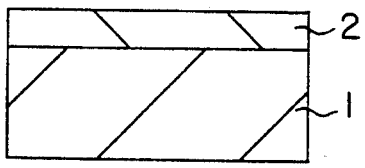
F I G. 1(b)
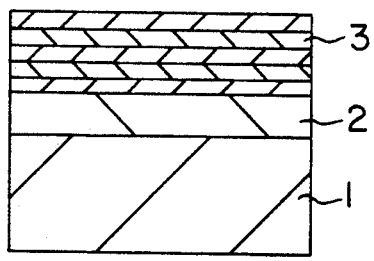
F I G. 1(c)
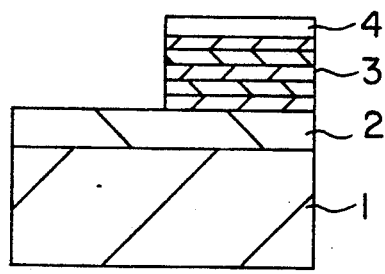
F I G. 1(d)
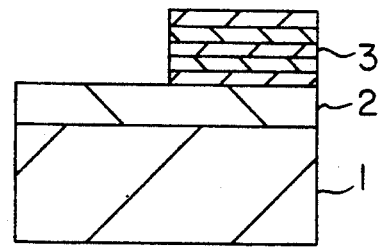
F I G. 1(e)
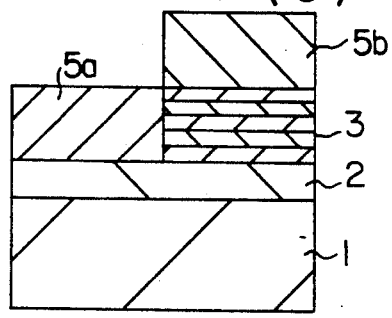
F I G. 1(f)
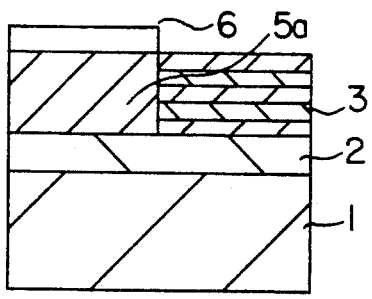
F I G. 1(g)
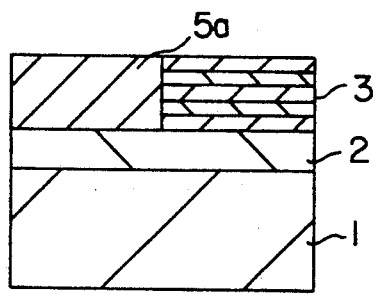
F I G. 1(h)

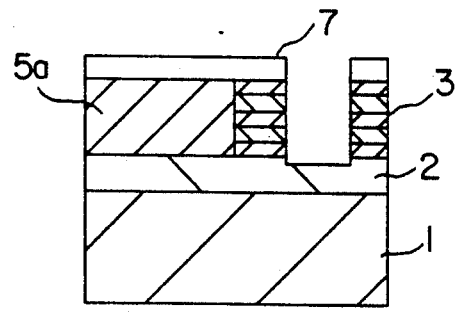
F I G. 2(a)
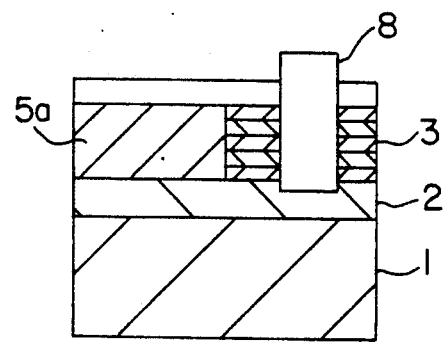
F I G. 2(b)
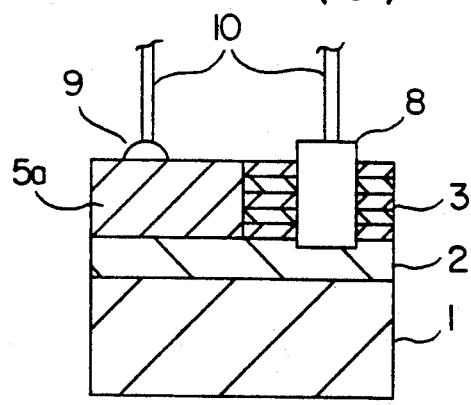
F I G. 2(c)

METHOD OF MANUFACTURING PN-JUNCTION DEVICE II-VI COMPOUND SEMICONDUCTOR

BACKGROUND OF THE INVENTION

1. Field of the Invention

This invention relates to a pn-junction device of a II-VI group compound semiconductor, and in particular to a LED (Light Emitting Diode) for blue light and a method of manufacturing the same.

2. Description of the Prior Art

Conventionally, LEDs of II-VI group compound semiconductor have been comprised, as is shown in FIG. 4, of layers of n-type ZnSe and p-type ZnSe stacked on a n-type GaAs substrate. This has been described, for example, in Abstract, The 6th International Conference on Molecular Beam Epitaxy, Aug. 8, 1990, San Diego School, California University, No. PIV-31. In such a device, electric current flows from p-type ZnSe and through n-type ZnSe to reach an n-type GaAs substrate.

With the structure as described above, however, sufficient light emission is not obtained due to incoincidence of the junction surface of the conduction band of n-type ZnSe and n-type GaAs. In addition, sufficient light emission is not obtained due to the low carrier-density of Li-doped p-type ZnSe.

SUMMARY OF THE INVENTION

It is an object of the present invention to provide a new pn-junction device, and in particular, a blue LED, having favorable light emitting characteristics with the junction of a p-type semiconductor material having high carrier density by a superlattice structure and an n-type semiconductor.

It is another object of the present invention to provide an efficient and reasonable method to manufacture the above-described pn-junction device.

In order to obtain the above-described object, the pn-junction device according to the present invention has a construction that, on a buffer layer formed upon a crystalline substrate or directly on the substrate, a region A of a II-VI group compound semiconductor doped with a donor impurity, and a region of superlattice comprising a material B of II-VI group compound semiconductor and a material C of a II-VI group compound semiconductor doped with an acceptor impurity, form a pn-junction.

In the above-described construction, the material C preferably has a forbidden band width larger than that of the material B.

Also, the material B is preferably a II-VI group compound semiconductor which is not doped with an acceptor impurity.

The method of manufacturing of the pn-junction device according to the invention comprises the steps of:

forming, on the whole buffer layer of a II-VI group compound semiconductor formed on a substrate, a superlattice structure consisting of a material B of a II-VI group compound semiconductor and a material C of a II-VI group compound semiconductor doped with the acceptor impurity, forming a protection layer comprising a desired pattern on the superlattice, applying a first etching to the superlattice layers in a discharging atmosphere of a gas containing one or more halogen elements (e.g. fluorine, chlorine, bromine, and iodine), and being below 50 mTorr pressure, applying a second etching in a discharging atmosphere of a gas containing one or more halogen elements, and having a pressure of 50 to 70 mTorr, and removing the protection layer, forming the body of the material A on the device after the above etching, so that the thickness of the material A formed on the part from which the superlattice was etched off is the same as that of the remaining part of the superlattice, forming a protection layer comprising a desired pattern on the material A, etching off the material A on the superlattice in an atmosphere of discharging gas containing one or more halogen elements (e.g. fluorine, chlorine, bromine, and iodine), and removing the protection layer.

It is preferrable in the above-described process that the superlattice is etched by the first and second etching down to the buffer layer.

Also, in addition to the above-described process, after the etching of a desired portion of the superlattice layers of the material B and material C, a metal electrode is formed on the etched-off region to obtain a lead-out electrode.

Also, in the above process, as the first method of etching the superlattice layer, sputter etching in a gas containing one or more of the halogen elements neon (Ne), argon (Ar), krypton (Kr), and xenon (Xe) can be used.

As the second method of etching the superlattice layer, etching in an atmosphere of a gas containing one or more of the halogen elements, fluorine, chlorine, bromine, and iodine is used.

As the third method to etch the superlattice layer, a method to etch first in a discharging atmosphere of a gas containing one or more of halogen elements, fluorine, chlorine, bromine, and iodine, and further to sputter-etch in a gas containing one or more of the halogen elements, neon (Ne) argon (Ar) krypton (Kr), and xenon (Xe) may be applied.

Also, in the above process, the metal electrode can be formed by sputtering a metal target. For the metal electrode, a metal containing gold (Au), or platinum (Pt) can be used.

Also, in the above-described manufacturing process, etching through the superlattice layers preferably reaches the substrate or the buffer layer of the II-VI group compound semiconductor.

The blue light emitting diode of the present invention has a structure in which side walls of an n-type zinc selenide (ZnSe) semiconductor region and a superlattice region consisting of ZnSe semiconductor and zinc-sulfide-selenide ($ZnS_xSe_{1-x}$) alloy form a pn-junction.

In the above-described structure, it is preferrable to form, as the substrate, on the GaAs substrate, a buffer layer of more than 0.7 μm which includes a $ZnS_xSe_{1-x}$ mixed crystal. This mixed crystal is of relatively high electric resistance compared with the pn-junction element.

Also, the value of x of the high resistance $ZnS_xSe_{1-x}$ mixed crystal buffer layer is preferably in the range 0 through 0.1.

Also, in the above-described structure, a ZnSe substrate or a substrate of ZnSe having a high-resistance ZnSe layer epitaxially formed thereon can be used.

Also, in the above-described structure, the ZnSe semiconductor forming the superlattice is preferably not doped with an acceptor or a donor.

Also, in the above-described structure, it is preferable to use one or more of the halogen elements fluorine (F), chlorine (Cl), bromine (Br) and iodine (I) as the donor impurity.

Also, in the above-described structure, it is preferable to use one or more of the elements nitrogen (N), phosphorous (P), and lithium (Li) as the acceptor impurity.

The pn-junction device according to the invention, being formed by a region of material A and a superlattice region consisting of material B and C, results in a junction of p-type semiconductor with high carrier density and n-type semiconductor, and a pn-junction having excellent characteristics.

The favorable structure of the present invention includes material C having a larger forbidden band width than that of the material B, and the II-VI group compound semiconductor not doped with an acceptor impurity as the material B is used. This results in a junction between material B having a p-type high carrier-density and material A.

By the addition of the acceptor impurity to the semiconductor with wide forbidden band only, carrier density in the material B does not decrease greatly, but the carrier mobility in the material B with narrow forbidden band improves due to small impurity-scattering. Accordingly, forming of a low-resistance p-type II-VI group compound semiconductor and a high quality pn-junction is possible.

In the blue LED according to the present invention, electric current flows through the n-type ZnSe and p-type superlattice part only, and is not affected by the GaAs substrate.

Also, by the addition of the acceptor impurity to the $ZnS_xSe_{1-x}$ mixed crystal part of the superlattice of $ZnSe-ZnS_xSe_{1-x}$, the ZnSe part in the superlattice becomes a p-type semiconductor with high carrier-density, and the pn-junction between the n-type ZnSe layer and the p-type ZnSe part make a blue LED with high luminance possible.

According to the method of manufacturing of the present invention, the above-described pn-junction device is manufactured efficiently and reasonably.

Plasma-etching in an atmosphere of a halogen including gas can make the etching without leaving VI-group-element in the II-VI-group-compound-semiconductor, and, since the II-VI-group-compound-semiconductor is etched anisotropically in the gas plasma involving halogen below 50 mTorr, the part of the II-VI-group-compound-semiconductor not covered by the protection layer of desired pattern is etched perpendicularly to the surface, so that processing with the desired pattern and step is possible.

Further, by applying the second etching process on the surface (of shallow depth) of the II-VI-group-compound-semiconductor in a plasma which includes a halogen at a pressure of 50 to 70 mTorr, a high quality surface for forming a favorable pn-junction can be obtained.

Thus, epitaxial growth of a high quality II-VI-group-compound-semiconductor and manufacturing of a blue LED is possible.

By forming, upon a GaAs substrate, a buffer layer of $ZnS_xSe_{1-x}$ mixed crystal of high resistance, and, further forming thereupon the pn-junction structure, a blue LED having high luminance becomes possible. By the formation of the layer of $ZnS_xSe_{1-x}$ (x=0~0.1), with a nearly equal lattice constant and greater than a 0.7 μm thickness on the GaAs substrate, the crystallinity of the pn-junction part is quite excellent due to the termination of the lattice relaxation.

The ZnSe layer of the superlattice with narrow forbidden band, without an impurity being added, becomes a low-resistance p-type layer having no impurity-scattering. Also, as the donor which makes the n-type ZnSe with high carrier-density and strong blue light emitting possible, fluorine, chlorine, bromine, or iodine, or the combination thereof is used. Also, for the acceptor for the high quality p-type superlattice, nitrogen, phosphorous, lithium, or any combination thereof may be used.

Further, the metal electrode which pierces through the p-type superlattice layers by etching the desired part of the superlattice layers can supply current to each ZnSe layer without being affected by the $ZnS_xSe_{1-x}$ barrier layer.

The superlattice is etched by sputter etching with an inert gas or by plasma etching with a halogen gas, and the etched surface is of good quality. By applying the sputter etching after the plasma etching, the halogen absorbed on the etched surface by the plasma etching can be removed, resulting in an improved surface. The metal electrode with lower contact resistance can be made by sputtering Au or Pt which has a Fermi level close to that of ZnSe.

BRIEF DESCRIPTION OF THE DRAWINGS

FIGS. 1(a) to (h) are diagrams showing the section of the device at every stage of the manufacturing according to the invention.

FIGS. 2(a) to (c) show a sectional view of the device at the stages following those stages shown in FIGS. (a) to (h).

DETAILED DESCRIPTION OF THE INVENTION

Figure 3:
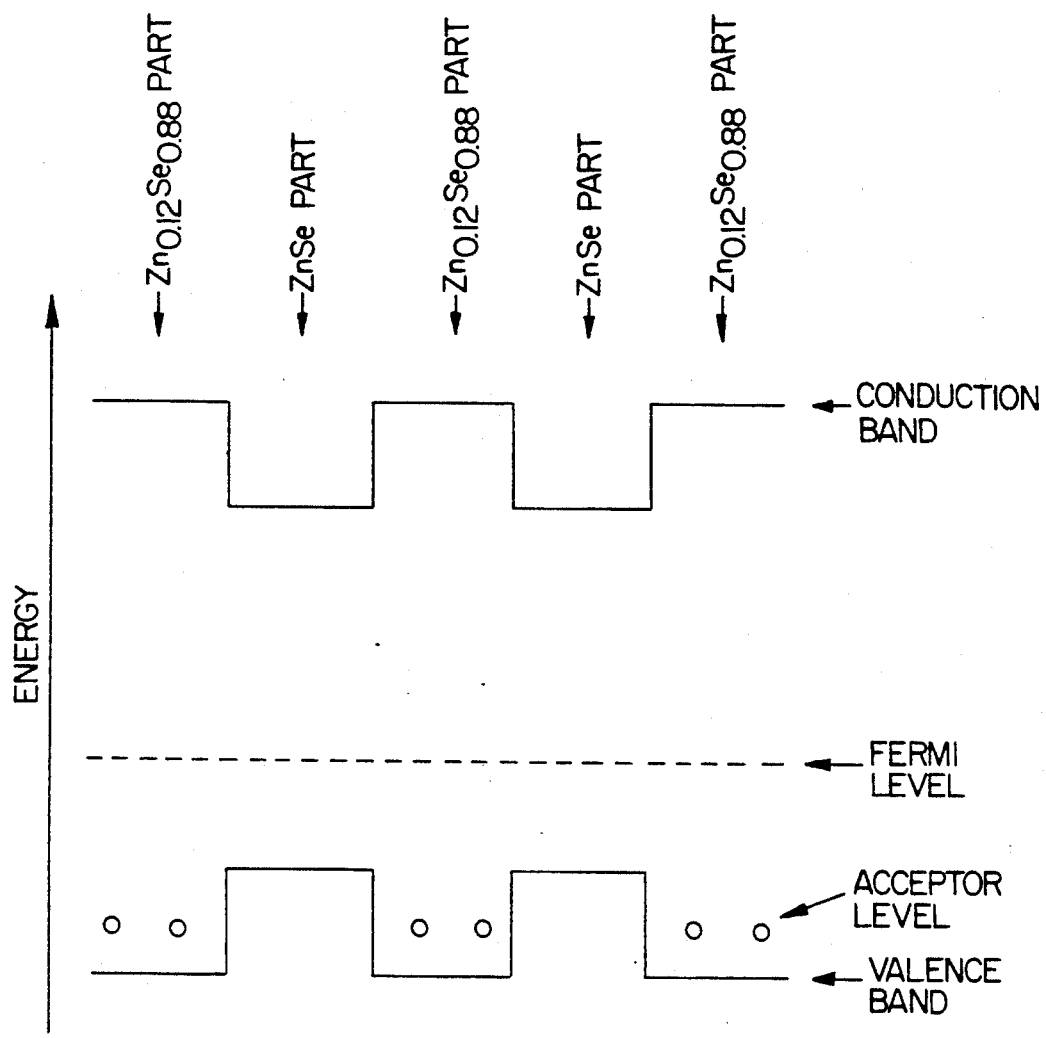
FIG. 3 illustrates the band structure of the ZnSe-ZnSSe superlattice.
Figure 4:
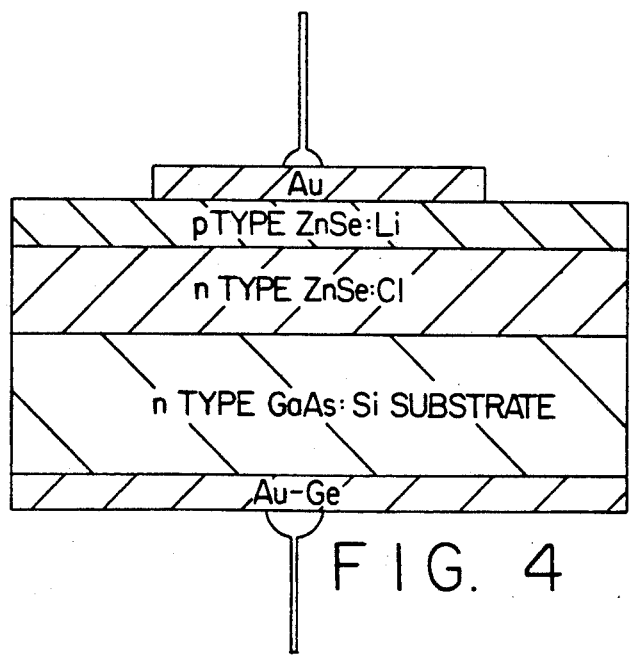
FIG. 4 is a sectional view of a conventional pn-junction device.

Referring now to the drawings, an embodiment of the present invention is explained below.

FIGS. 1(a) to (h) are diagrams showing the manufacturing process of the LED using the pn-junction device according to the invention.

Upon a semi-insulating GaAs substrate 1 shown in FIG. 1(a), is grown a buffer layer 2 of about 2 μm thickness of $ZnS_{0.06}Se_{0.94}$. Buffer layer 2 is of relatively high electric resistance compared with the pn-junction proper and is doped with neither an acceptor nor a donor (FIG. 1(b)). The buffer layer 2 prevents the substrate 1 of III-V group compound semiconductor GaAs from being etched and decomposed when, later, the superlattice layer 3 is provided with a hole as shown in FIG. 2(a).

For the buffer layer 2, in order to offset the influence of the difference of the lattice constant with that of the GaAs substrate 1, $ZnS_xSe_{1-x}$ mixed crystal, where x=0 through 0.1, is preferrable, and the thickness thereof being preferably more than 0.7 μm, for which the crystallization is improved by lattice relaxation. Instead of GaAs, other crystalline material such as ZnSe may be used for the substrate. For the substrate of ZnSe, epitaxial depostion of a buffer layer 2 of ZnSe of more than 0.1 μm thickness is preferred, since the surface of the ZnSe substrate is more or less irregular; if the surface is extremely even and of high quality, no buffer layer is necessary. Any substrate or any buffer-layer is to be of high electric resistance, so that electric current does not flow therethrough.

As shown in FIG. 1(c), on the buffer layer 2 of $ZnS_{0.06}Se_{0.94}$, a superlattice part 3 consisting of pairs of ZnSe semiconductor layer and $ZnS_{0.12}Se_{0.88}$ mixed crystal semiconductor layer including an acceptor impurity are epitaxially formed and stacked in order. As for the $ZnS_xSe_{1-x}$ mixed crystal part of the superlattice layer 3, the larger the x is, the better, as the larger the x is, the higher the ZnSe carrier density is.

According to the present embodiment, for the buffer layer 2, $ZnS_{0.06}Se_{0.94}$ is adopted. On the buffer layer, a superlattice layer 3 is deposited by epitaxially growing ZnSe and $ZnS_{0.12}Se_{0.88}$ alternately 500 times, the thickness of ZnSe and $ZnS_{0.12}Se_{0.88}$ layer being 2 nm each and the total thickness of the superlattice part 3 being 2 $\mu$m. The coincidence of the mean lattice constant of the superlattice and that of the buffer layer results in excellent crystallization of the superlattice. The composition and thickness of the constituents of superlattice layer 3, as described above result in excellent crystallization. However, it is understood that the above-described data is merely exemplary.

Generally, in a II-VI group compound semiconductor, ionization energy from the acceptor level is much larger than the thermal energy of room temperature, resulting in a low activation-ratio and a low carrier-density.

FIG. 3 illustrates the bank structure of the superlattice structure 3 of $ZnSe-ZnS_{0.12}Se_{0.88}$. As is seen in FIG. 3, if, in order to make the ZnSe part of the superlattice 3 p-type, only $ZnS_{0.12}Se_{0.88}$ part is doped with nitrogen, which is an acceptor impurity, the Fermi level approaches to the valence band of the ZnSe part, which becomes a p-type layer with high hole-density. Further, as the ZnSe layer of the superlattice is not doped with any impurity, impurity scattering is suppressed and the positive holes obtain high mobility. Besides nitrogen, as the acceptor impurity, phosphorous or lithium has the same effect.

Further processing is then applied to the device, as shown in FIG. 1(d).

The device is covered with photoresist 4, exposed to light with a mask of a desired pattern and developed. Instead, the device may be covered with a photoresist 4 with a desired pattern. The device thus consisting of the superlattice 3 and the photoresist 4 thereon is laid on a cathode electrode of a dry-etching equipment, which is then evacuated. After exhausting various materials adsorped on the sample or on the inner wall of the equipment by a high vacuum of up to $10^{-6}$ Torr, boron trichloride is introduced into the equipment. The pressure of the boron trichloride is below 50 mTorr. Below 60 mTorr, anisotropic etching is possible, and, especially, below 50 mTorr, stable anisotropic etching becomes possible, resulting in etching faithful to the pattern of the photoresist 4.

Applying the electrodes with high-frequency electric power, plasma of boron trichloride is generated, the power density of the electric power being about 1.1 W/cm. While discharging, the cathode electrode is cooled with water to prevent temperature rise of the device.

The etching is stopped when the superlattice part is partially etched away in accordance with the desired pattern and part of the buffer layer 2 is exposed, as shown in FIG. 1(d). The quality of the II-VI group compound semiconductor etched in the atmosphere of boron trichloride below 50 mTorr is not always the best, and, rather, there is produced a damaged layer on the etched surface, which becomes an obstacle for the pn-junction formed later on the side wall, and further etching to remove the damaged layer is necessary. The damaged layer is removed by etching again in plasma of boron trichloride at a pressure of 50 to 70 mTorr, which is the best condition. The damaged layer, seemingly of 1 $\mu$m thick only, can be easily removed, and a device with the desired pattern and excellent semiconductor-characteristic is obtained, as shown in FIG. 1(e).

Then, as shown in FIG. 1(f), on the device having superlattice 3 partially removed, an n-type ZnSe epitaxial layer 5a with chlorine (Cl) as the donor impurity is grown to the same height as the super-lattice 3. As the donor impurity, other halogens, including fluorine, (F), bromine (Br), or iodine (I) or the combination thereof is applicable.

As shown in FIG. 1(g), the device is covered with the photoresist 6 on the n-type ZnSe layer 5a, and laid on the cathode electrode of the dry etching equipment. As, in this case, the semiconductor surface is not necessarily required to be of high quality, the pressure of the boron tetrachloride may be of any value below 80 mTorr. In an exemplary embodiment of the present invention, 60 mTorr is adopted. As a result, n-type ZnSe layer 5b on the superlattice 3 is removed and a device as shown in FIG. 1(g) is obtained. With the photoresist 6 removed, a device having the structure as shown in FIG. 1(h) is obtained. The pn-junction surface, which is perpendicular to the substrate surface in the case of the embodiment, may be oblique too.

Next, electrodes are formed as shown in FIG. 2. Since the superlattice layer 3 is as thick as about 2 $\mu$m, etching is made by both dry etching with boron trichloride and by sputtering with argon gas.

First, as illustrated in FIG. 2(a), a metal mask 7 is laid on the device shown in FIG. 1(h). The device is then laid on the cathode electrode of the dry etching equipment. The pressure of the boron tetrachloride gas is desirably set at 40 mTorr. Below 50 mTorr of boron tetrachloride gas pressure, a II-VI group compound semiconductor is etched anisotropically, and nearly vertically to the surface, so that application for the electrode formation is possible. The purpose of the etching is to reach the buffer layer 2 so that all of the ZnSe layer in the superlattice can contact with the electrode.

Further, in order to remove the chlorine adsorped by the device and to make the surface (of shallow depth) of the electrode-forming-part clean, sputter etching with argon gas may be applied. This cleaning is not always necessary, if, after the dry etching with halogen, sufficient time is passed for the halogen to evaporate.

If the superlattice layer 3 is thin, only sputter etching is sufficient. The gas for the sputtering may be neon (Ne), argon (Ar), krypton (Kr), xenon (Xe), or any combination thereof.

Next, as shown in FIG. 2(b), a metal electrode 8 is formed. The device thus prepared as shown in FIG. 2(a) is introduced into the sputtering equipment, and, there, by sputtering a platinum target, a metal electrode 8 of Pt is formed, which, having close contact with every p-type ZnSe layer in the superlattice 3 as the result of sputter deposition, is a favorable Ohmic electrode with low contact-resistance. For the metal electrode, gold (Au), Pt or Au added with an acceptor impurity of a II-VI group compound semiconductor is also available.

The n-type ZnSe 5a may then be provided with Ohmic electrode 9 by coating with In-Hg amalgam and annealing. The device is then provided with lead wires 10 on both the p-type layer and n-type layer. A blue LED is thus obtained.

As explained above, according to the invention, by joining an n-type II-VI group compound semiconductor with a p-type II-VI-group-compound semiconductor having high carrier-density by superlattice structure, a pn-junction device with favorable characteristics or a highly efficient blue LED of ZnSe and $ZnS_xSe_{1-x}$ mixed crystal semiconductor is possible. In addition, with dry etching and the development of repeated epitaxial processing and electrode-forming technology on the p-type superlattice layer, manufacturing of pn-junction device or blue LED of II-VI group compound semiconductor is possible.

What is claimed:

1. A method of manufacturing a pn-junction device characterized in that the method comprises the steps of:
    forming a buffer layer of II-VI group compound semiconductor on a crystalline substrate,
    stacking on the buffer layer, pairs of superlattice layer comprising a II-VI group compound semiconductor layer and a acceptor impurity-doped II-VI group compound semiconductor endowed with forbidden band width layer larger than that of the II-VI group compound semiconductor,
    forming, on the superlattice layers, a protection layer with desired pattern,
    etching the surface of the superlattice layers not covered by the protection layer in a discharging atmosphere of gas containing one or more of halogen elements and having pressure below 50 mTorr for the first time to expose a portion of said buffer layer, said etching producing a damaged layer on said etched surface,
    etching said damaged layer in a discharging atmosphere of gas containing one or more of halogen elements and having pressure of 50 to 70 mTorr for the second time,
    removing the protection layer,
    forming a donor impurity-doped II-VI group compound semiconductor layer above a portion of the buffer layer from which the superlattice layer is etched off and above a portion of the buffer layer from which the superlattice layer is not etched off,
    covering with a further protection layer the donor impurity-doped II-VI group compound semiconductor formed above the portion of the buffer layer from which the superlattice is etched off,
    etching the donor impurity-doped II-VI group compound semiconductor layer not covered by the further protection layer in a discharging atmosphere of gas containing one or more of halogen elements
    and removing the further protection layer.

2. A method of manufacturing a pn-junction device according to claim 1, characterized in that the device is, after the removal of the last protection layer, provided with etching a desired portion of the superlattice layer region, and forming a metal electrode into the hole made by the etching.

3. A method of manufacturing a pn-junction device according to claim 2, characterized in that the etching of a desired portion of the superlattice layer region is carried out by sputter etching in a gas containing a halogen selected from the group consisting of neon (Ne), argon (Ar), krypton (Kr), and xenon (Xe).

4. A method of manufacturing a pn-junction device according to claim 2, characterized in that the etching of a desired portion of the superlattice layer region is carried out in a discharging atmosphere of gas containing at least one halogen element.

5. A method of manufacturing a pn-junction device according to claim 2, characterized in that the etching of a desired portion of the superlattice layer region is made by etching in an discharging atmosphere of gas containing one or more of halogen elements, and after that, sputter-etching in a gas containing a halogen selected from the group consisting of neon (Ne), argon (Ar), krypton (Kr), and xenon (Xe).

6. A method of manufacturing a pn-junction device according to claim 2, characterized in that the forming of the metal electrode is carried out by sputtering a metal target.

7. A method of manufacturing a pn-junction device according to claim 5, characterized in that the metal electrode is formed with a metal containing one of gold (Au) and platinum (Pt).

8. A method of manufacturing a pn-junction device according to claim 2, characterized in that the etching of the desired portion of the superlattice layer region reaches at least the buffer layer.

* * * * *